(12) United States Patent
Qin et al.

(10) Patent No.: US 11,881,812 B2
(45) Date of Patent: Jan. 23, 2024

(54) POWER SWITCH CIRCUIT AND POWER SWITCH

(71) Applicant: SHENZHEN POWEROAK NEWENER CO., LTD, Shenzhen (CN)

(72) Inventors: Geng Qin, Shenzhen (CN); Xiangzhu Yin, Shenzhen (CN); Hui Ma, Shenzhen (CN); Hua Zhang, Shenzhen (CN)

(73) Assignee: SHENZHEN POWEROAK NEWENER CO., LTD, Shenzhen (CN)

( * ) Notice: Subject to any disclaimer, the term of this patent is extended or adjusted under 35 U.S.C. 154(b) by 0 days.

(21) Appl. No.: 18/318,913

(22) Filed: May 17, 2023

(65) Prior Publication Data
US 2023/0291351 A1 Sep. 14, 2023

Related U.S. Application Data

(63) Continuation of application No. PCT/CN2022/081473, filed on Mar. 17, 2022.

(30) Foreign Application Priority Data

Dec. 9, 2021 (CN) .......................... 202111499303.9

(51) Int. Cl.
*H02S 40/30* (2014.01)

(52) U.S. Cl.
CPC ........... *H02S 40/30* (2014.12); *H02J 2300/22* (2020.01); *H02J 2300/24* (2020.01)

(58) Field of Classification Search
CPC .... H02S 40/30; H02J 2300/22; H02J 2300/24
See application file for complete search history.

(56) References Cited

U.S. PATENT DOCUMENTS

2016/0062383 A1* 3/2016 Nagasawa ................. G05F 3/24
307/130

FOREIGN PATENT DOCUMENTS

CN           201041953 Y     9/2012

* cited by examiner

*Primary Examiner* — Carlos Amaya
(74) *Attorney, Agent, or Firm* — IPRO, PLLC

(57) ABSTRACT

A power switch circuit includes a switch circuit, a solar photovoltaic panel and a detection circuit and connected with the solar photovoltaic panel and the switch circuit respectively. The solar photovoltaic panel is configured to provide an electrical signal to the detection circuit, the detection circuit is configured to detect whether the power in the electric signal exceeds a preset threshold, and when the power exceeds the preset threshold, the detection circuit outputs a first control signal to the switch circuit to turn on the switch circuit; when the switch circuit is turned on, the solar photovoltaic panel supplies power to the load through the switch circuit, and the switch circuit feeds back a second control signal to the detection circuit so that the detection circuit stops working.

16 Claims, 3 Drawing Sheets

POWER SWITCH CIRCUIT AND POWER SWITCH

CROSS-REFERENCE TO RELATED APPLICATIONS

The present application claims the benefit of and priority to Chinese Patent Application No. 202111499303.9, filed with the Chinese Patent Office on Dec. 9, 2021, titled "A POWER SWITCH CIRCUIT AND POWER SWITCH", which is hereby incorporated by reference in its entirety.

TECHNICAL FIELD OF THE INVENTION

The present application relates to the field of new energy photovoltaic power generation, and for example, relates to a power switch circuit and a power switch.

BACKGROUND OF THE INVENTION

When solar photovoltaic panels work, it is usually necessary to check the output state of the solar photovoltaic panels to determine whether the power generation system can be started. Because of the self-power consumption of the power generation system, it is necessary to well control the starting time of the power generation system for the solar photovoltaic panels. If the starting time is too early, the output power of the solar photovoltaic panels cannot meet the power consumption of the power generation system itself, which leads to consumption of power energy of external power grids or batteries; and if the starting time is too late, a part of the output energy of the solar photovoltaic panels will be wasted.

In the prior art, whether the power generation system can be started is usually determined by detecting the output voltage of the solar photovoltaic panels. In this practice, in order to prevent the power generation system from consuming the power energy of external power grids or batteries due to insufficient power of the solar photovoltaic panels, the voltage detection point is usually set higher, and the power generation system is started only when the output power of the solar photovoltaic panels is much greater than the power consumption of the power generation system, which leads to waste of the output energy of the solar photovoltaic panels and reduction of the efficiency for photovoltaic power generation.

SUMMARY OF THE INVENTION

In a first aspect, an embodiment of the present application provides a power switch circuit, the power switch circuit includes a solar photovoltaic panel, a detection circuit and a switch circuit, wherein the detection circuit is connected with the solar photovoltaic panel and the switch circuit respectively, and the solar photovoltaic panel is connected with a load through the switch circuit; the solar photovoltaic panel is configured to provide an electrical signal to the detection circuit; the detection circuit is configured to detect whether the power in the electric signal exceeds a preset threshold, and when the power in the electric signal exceeds the preset threshold, the detection circuit outputs a first control signal to the switch circuit to turn on the switch circuit; when the switch circuit is turned on, the solar photovoltaic panel supplies power to the load through the switch circuit, and at the same time, the switch circuit feeds back a second control signal to the detection circuit so that the detection circuit stops working.

Alternatively, the detection circuit includes a first switch module and a power detection module, a first terminal of the first switch module is connected with the solar photovoltaic panel and the switch circuit respectively, a second terminal of the first switch module is connected with a third terminal of the power detection module, and a third terminal of the first switch module is used for grounding, wherein the first terminal of the first switch module is a control terminal; a first terminal of the power detection module is connected with the solar photovoltaic panel, and a second terminal of the power detection module is connected with the switch circuit; the solar photovoltaic panel is configured to output the electrical signal to turn on the first switch module; when the first switch module is turned on, the power detection module enters a working state to detect the power in the electrical signal. In response to the power in the electrical signal detected by the power detection module greater than the preset threshold, the power detection module outputs the first control signal to the switch circuit to turn on the switch circuit; and meanwhile, the switch circuit feeds back the second control signal to the first terminal of the first switch module to turn off the first switch module so that the detection circuit stops working.

Alternatively, the first switch module includes a voltage dividing unit and a first switch tube Q1; a first terminal of the voltage dividing unit is connected with the solar photovoltaic panel, a second terminal of the voltage dividing unit is connected with a control terminal of the first switch tube Q1, a third terminal of the voltage dividing unit is used for grounding; the control terminal of the first switch tube Q1 is further connected with the switch circuit, a first terminal of the first switch tube Q1 is connected with the third terminal of the power detection module, and a second terminal of the first switch tube Q1 is used for grounding.

Alternatively, the voltage dividing unit includes a first resistor R1 and a second resistor R2; a first terminal of the first resistor R1 is connected with the solar photovoltaic panel, a second terminal of the first resistor R1 is connected with the control terminal of the first switch tube Q1, a first terminal of the second resistor R2 is connected with the control terminal of the first switch tube Q1, and a second terminal of the second resistor R2 is used for grounding.

Alternatively, the power detection module includes a third resistor R3, a fourth resistor R4, a second switch tube Q2 and a voltage stabilizing diode D1; a first terminal of the third resistor R3 is connected with the solar photovoltaic panel, a second terminal of the third resistor R3 is connected with the cathode of the voltage stabilizing diode D1, the anode of the voltage stabilizing diode D1 is connected with a control terminal of the second switch tube Q2 and a first terminal of the fourth resistor R4, a first terminal of the second switch tube Q2 is connected with the switch circuit, a second terminal of the second switch tube Q2 is used for grounding, and a second terminal of the fourth resistor R4 is connected with the second terminal of the first switch module.

Alternatively, the switch circuit includes a second switch module and a third switch module; a first terminal of the second switch module is connected with the solar photovoltaic panel, a second terminal of the second switch module is a control terminal and connected with the detection circuit, a third terminal of the second switch module is connected with a second terminal of the third switch module and the load respectively, and the second terminal of the third switch module is a control terminal; a first terminal of the third switch module is connected with the detection circuit, a third terminal of the third switch module is used for grounding;

the detection circuit is configured to detect the electrical signal output by the solar photovoltaic panel, and in response to the power in the electrical signal greater than the preset threshold, the detection circuit outputs the first control signal to the second terminal of the second switch module to turn on the second switch module, the electrical signal flows into the second terminal of the third switch module while flowing into the load through the second switch module so as to turn on the third switch module, and the second control signal is fed back to the first terminal of the first switch module to turn off the first switch module so that the detection circuit stops working.

Alternatively, the switch circuit further includes a diode D2; the anode of the diode D2 is connected with the first terminal of the first switch module, and the cathode of the diode D2 is connected with the first terminal of the third switch module.

Alternatively, the second switch module includes a fifth resistor R5, a sixth resistor R6 and a third switch tube Q3; a first terminal of the third switch tube Q3 is connected with the solar photovoltaic panel, a control terminal of the third switch tube Q3 is connected with a first terminal of the sixth resistor R6, a second terminal of the third switch tube Q3 is connected with the load, a second terminal of the sixth resistor R6 is connected with the detection circuit and the first terminal of the third switch module respectively, and the fifth resistor R5 is connected with the first terminal and the control terminal of the third switch tube Q3.

Alternatively, the third switch module includes a seventh resistor R7 and a fourth switch tube Q4; a first terminal of the seventh resistor R7 is connected with the second terminal of the third switch tube Q3, a second terminal of the seventh resistor R7 is connected with a control terminal of the fourth switch tube Q4, a first terminal of the fourth switch tube Q4 is connected with the detection circuit, and a second terminal of the fourth switch tube Q4 is used for grounding.

In a second aspect, an embodiment of the present application further provides a power switch which includes the power switch circuit as described in the first aspect.

BRIEF DESCRIPTION OF DRAWINGS

One or more embodiments are illustrated by corresponding attached drawings, and this does not constitute limitation on the embodiments. Elements with the same reference numerals in the attached drawings are shown as similar elements, and the pictures in the attached drawings do not constitute scale limitation unless otherwise stated particularly.

DETAILED DESCRIPTION OF THE INVENTION

In order to make objectives, technical solutions and advantages of the present application clearer, the present application will be further described in detail hereinafter with reference to attached drawings and embodiments. It shall be appreciated that, the specific embodiments described herein are only used to explain the present application, and are not used to limit the present application.

It shall be noted that, all features in the embodiments of the present application may be combined with each other without conflict, and all the combinations are within the scope claimed in the present application. In addition, although functional module division is made in the schematic diagrams of the device and logical sequences are shown in the flowchart diagrams, in some cases, the steps shown or described can be executed with module division and sequences different from those in the schematic diagrams of the device and the flowchart diagrams.

Unless otherwise defined, all technical and scientific terms used in this specification have the same meanings as commonly understood by those skilled in the art of the present invention. In this specification, the terms used in the specification of the present invention are only for the purpose of describing specific embodiments, and are not intended to limit the present invention. The term "and/or" used in this specification includes any and all combinations of one or more associated items listed.

Figure 1:
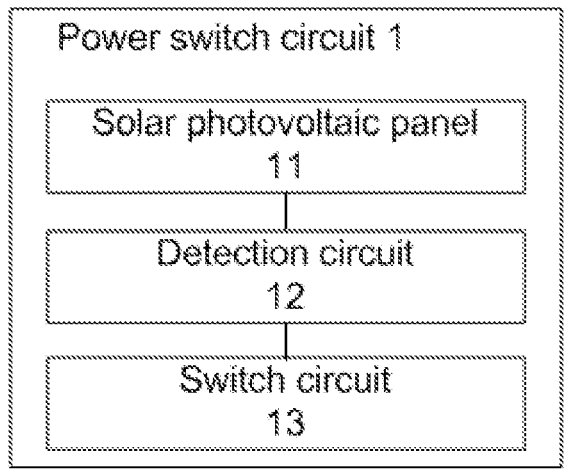
FIG. 1 is a structural block diagram of a power switch circuit according to an embodiment of the present application.

Please refer to FIG. 1, which is a structural block diagram of a power switch circuit according to an embodiment of the present application. As shown in FIG. 1, a power switch circuit 1 includes a solar photovoltaic panel 11, a detection circuit 12 and a switch circuit 13. The detection circuit 12 is connected with the solar photovoltaic panel 11 and the switch circuit 13 respectively.

The solar photovoltaic panel 11 is connected with a load through the switch circuit 13, the solar photovoltaic panel 11 is configured to provide electrical signals to the detection circuit 12; specifically, the solar photovoltaic panel 11 generates light energy by receiving sun light and converts the light energy into electrical signals; that is, the solar photovoltaic panel outputs power energy and then inputs the electrical signals to the detection circuit 12.

The detection module 12 is configured to receive the electrical signal output by the solar photovoltaic panel 11 when the solar photovoltaic panel 11 generates electricity, and detect whether the power in the electrical signal generated by the solar photovoltaic panel 11 exceeds a preset threshold; when it is detected that the power in the electrical signal exceeds the preset threshold, the detection circuit 12 outputs a first control signal to the switch circuit 13 so that the switch circuit 13 is turned on. Specifically, the switch circuit 13 is a self-holding switch circuit; that is, after the detection circuit 12 stops working, the switch circuit 13 is still in a conductive state.

Figure 2:
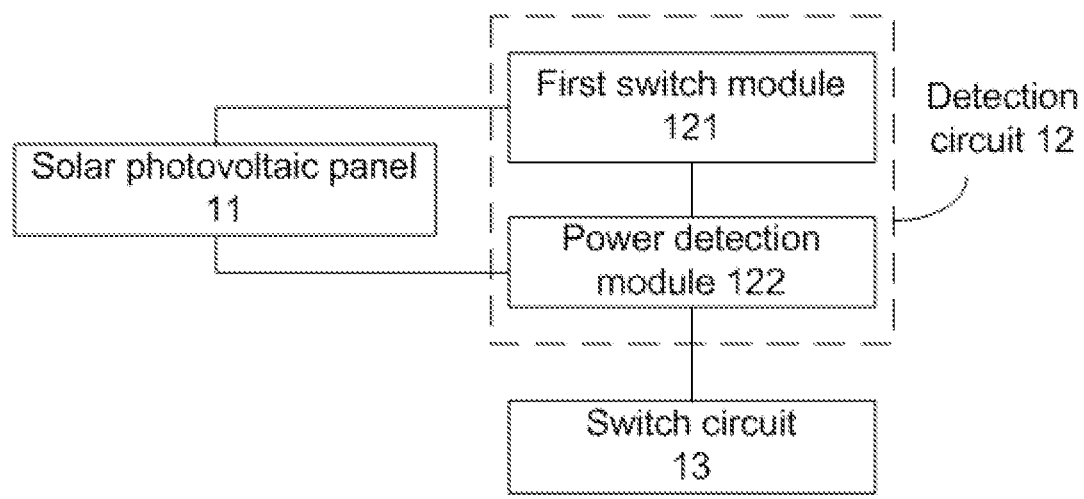
FIG. 2 is a structural block diagram of a detection circuit in a power switch circuit according to the embodiment of the present application.

The detection circuit 12 includes a first switch module 121 and a power detection module 122; as shown in FIG. 2, which is a structural block diagram of a detection circuit in a power switch circuit according to the embodiment of the present application, a first terminal of the first switch module 121 is connected with the solar photovoltaic panel 11 and the switch circuit 13 respectively, a second terminal of the first switch module 121 is connected with a third terminal of the power detection module 122, and a third terminal of the first switch module 121 is used for grounding; a first terminal of the power detection module 122 is connected with the solar photovoltaic panel 11, and a second terminal of the power detection module 122 is connected with the switch circuit 13, wherein a first terminal of the first switch module 121 is a control terminal.

Specifically, the solar photovoltaic panel 11 is configured to output the electrical signal to turn on the first switch module 121; when the first switch module 121 is turned on, the power detection module 122 enters a working state to detect the power in the electrical signal, and when it is detected by the power detection module 122 that the power in the electrical signal is greater than the preset threshold, the power detection module 122 outputs a first control signal to the switch circuit 13 to turn on the switch circuit 13; at the same time, the switch circuit 13 feeds back a second control signal to the first terminal of the first switch module 121 to turn off the first switch module 121 so that the detection circuit 12 stops working.

The switch circuit 13 is configured to receive the first control signal output by the detection circuit 12, when the switch circuit 13 is turned on according to the first control signal, the solar photovoltaic panel 11 supplies power to the load through the switch circuit 13, and the switch circuit 13 feeds back the second control signal to the detection circuit 12 so that the detection circuit 12 stops working.

Figure 3:
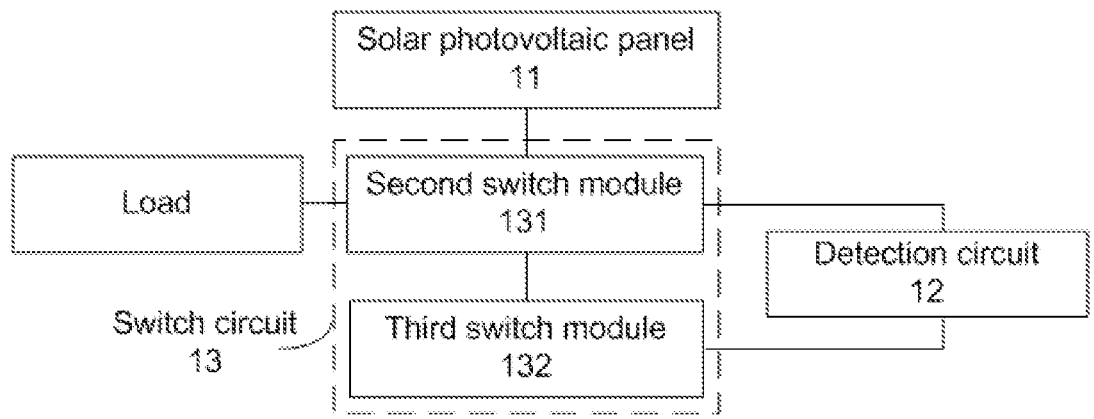
FIG. 3 is a structural block diagram of a switch circuit in a power switch circuit according to the embodiment of the present application.

The switch circuit 13 includes a second switch module 131 and a third switch module 132; as shown in FIG. 3, which is a structural block diagram of a switch circuit in a power switch circuit provided according to the embodiment of the present application, a first terminal of the second switch module 131 is connected with the solar photovoltaic panel 11, a second terminal of the second switch module 131 is connected with the detection circuit 12, a third terminal of the second switch module 131 is connected with a second terminal of the third switch module 132 and the load respectively, wherein the second terminal of the second switch module is a control terminal, and the second terminal of the third switch module is a control terminal; a first terminal of the third switch module 132 is connected with the detection circuit 12, and a third terminal of the third switch module 132 is used for grounding.

Specifically, the detection circuit 12 is configured to detect the electrical signal output by the solar photovoltaic panel 11, and in response to the power in the electrical signal greater than the preset threshold, the detection circuit 12 outputs the first control signal to the second terminal of the second switch module 131 to turn on the second switch module 131, and the electrical signal flows into the second terminal of the third switch module 132 while flowing into the load through the second switch module 131 so as to turn on the third switch module 132, and the second control signal is fed back to the first terminal of the first switch module 121 to turn off the first switch module 121 so that the detection circuit 12 stops working. Moreover, the second terminal of the second switch module 131 is connected with the first terminal of the third switch module 132; when the third switch module 132 is turned on, the first control signal is provided to the second terminal of the second switch module 131 so that the second switch module 131 is kept in a conductive state and the self-holding switch function is realized. In this embodiment, the first terminal of the third switch module 132 is connected with the second terminal of the second switch module 131, and the third terminal of the third switch module 132 is grounded; after the third switch module 132 is turned on, i.e., the first terminal of the third switch module 132 is electrically connected with the third terminal thereof, the second terminal of the second switch module 131 is grounded so that the second switch module 131 is controlled to be in a conductive state, and thus the second switch module 131 is kept in a conductive state. It is worth mentioning that, the first control signal and the second control signal in this embodiment may be the same signal or different signals provided that the second control signal controls the first switch module 121 to be turned off and the first control signal controls the second switch module 131 to be turned on.

Figure 4:
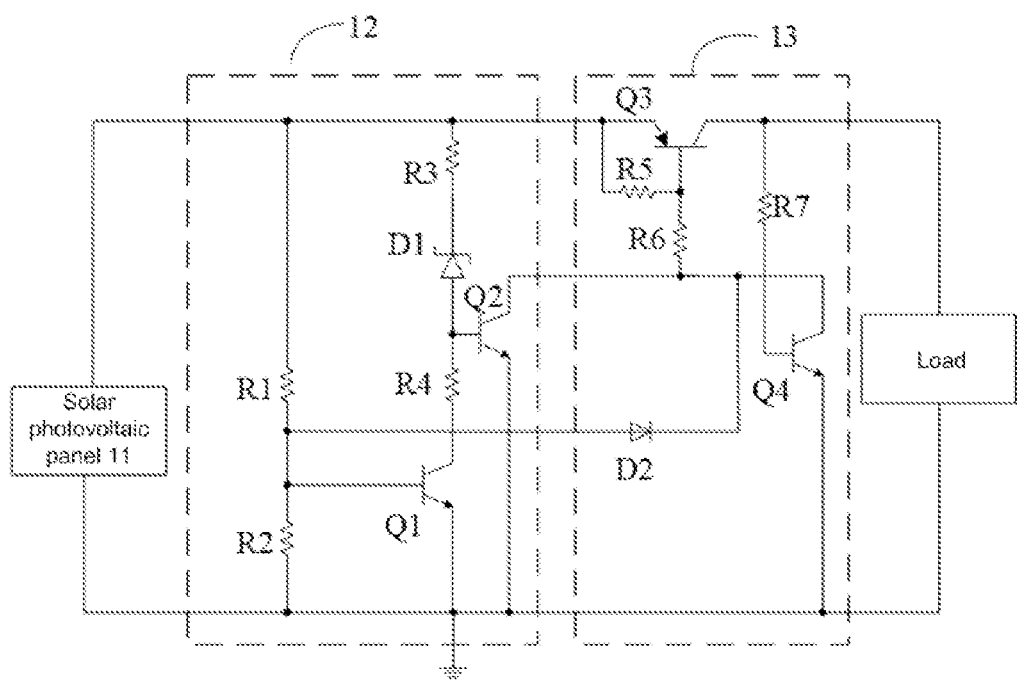
FIG. 4 is a circuit diagram of a power switch circuit according to the embodiment of the present application.

Please refer to FIG. 4, which is a circuit diagram of a power switch circuit according to the embodiment of the present application; as shown in FIG. 4, the power switch circuit 1 includes a first resistor R1, a second resistor R2, a third resistor R3, a fourth resistor R4, a fifth resistor R5, a sixth resistor R6, a seventh resistor R7, a first switch tube Q1, a second switch tube Q2, a third switch tube Q3, a fourth switch tube Q4, a voltage stabilizing diode D1 and a diode D2.

Specifically, the detection circuit 12 includes the first resistor R1, the second resistor R2, the third resistor R3, the fourth resistor R4, the voltage stabilizing diode D1, the first switch tube Q1 and the second switch tube Q2. The first resistor R1 and the second resistor R2 constitute a voltage dividing unit, and the voltage dividing unit and the first switch tube Q1 constitute the first switch module 121. The third resistor R3, the fourth resistor R4, the voltage stabilizing diode D1 and the second switch tube Q2 constitute the power detection module 122.

A first terminal of the voltage dividing unit is connected with the solar photovoltaic panel 11, a second terminal of the voltage dividing unit is connected with a control terminal of the first switch tube Q1, and a third terminal of the voltage dividing unit is used for grounding; the control terminal of the first switch tube Q1 is further connected with the switch circuit 13, a first terminal of the first switch tube Q1 is connected with the third terminal of the power detection module 122, and a second terminal of the first switch tube Q1 is used for grounding.

A first terminal of the first resistor R1 is connected with the solar photovoltaic panel 11, a second terminal of the first resistor R1 is connected with the control terminal of the first switch tube Q1, a first terminal of the second resistor R2 is connected with the control terminal of the first switch tube Q1, and a second terminal of the second resistor R2 is used for grounding.

A first terminal of the third resistor R3 is connected with the solar photovoltaic panel 11, a second terminal of the third resistor R3 is connected with the cathode of the voltage stabilizing diode D1, the anode of the voltage stabilizing diode D1 is connected with a control terminal of the second switch tube Q2 and a first terminal of the fourth resistor R4, a first terminal of the second switch tube Q2 is connected with the switch circuit 13, a second terminal of the second switch tube Q2 is used for grounding, and a second terminal of the fourth resistor R4 is connected with the second terminal of the first switch module.

Specifically, the solar photovoltaic panel 11 is configured to provide the electrical signal, and the electrical signal flows into the control terminal of the first switch tube Q1 after voltage division by the first resistor R1 and second resistor R2 so as to turn on the first switch tube Q1. When the first switch tube Q1 is turned on, the loop connected with the power detection module 122 is turned on, and the voltage stabilizing diode D1 in the power detection module 122 detects the voltage output by the solar photovoltaic panel 11; when it is detected that the voltage is greater than the breakdown voltage of the voltage stabilizing diode D1, the voltage stabilizing diode D1 is turned on, and the current output by the solar photovoltaic panel 11 flows through the third resistor R3, the voltage stabilizing diode D1 and the fourth resistor R4. When the voltage rises, the current flowing through the fourth resistor R4 also increases synchronously, and when the current flowing through the fourth resistor R4 exceeds the set threshold, the second switch tube Q2 is turned on. That is, after it is detected that the voltage and current reach the set values, the second switch tube Q2 is turned on; that is, when it is detected that the power reaches the preset threshold, the second switch tube Q2 is controlled to be turned on. In this way, power detection can be realized simply by providing a simple power detection module 122, such as the third resistor R3, the voltage stabilizing diode D1, the fourth resistor R4, and the second switch tube Q2, thereby greatly reducing the cost of the power detection module 122. Meanwhile, the switch circuit 13 is controlled to be turned on only when it is detected by the power detection module 122 that the power is greater than the preset threshold. In this way, the case where the starting time is too early so that the output power of the solar photovoltaic panel 11 cannot meet the power consumption of the power generation system itself and thus power energy of the external power grid or battery is consumed as well as the case where the starting time is too late and thus a part of the output energy of the solar photovoltaic panel 11 is wasted can be effective avoided, thereby improving the power generation capacity of the solar photovoltaic panel 11 and improving the efficiency for photovoltaic power generation. In this embodiment, since the second terminal of the second switch tube Q2 is grounded, the first control signal provided is a low-level signal or a ground signal when the second switch tube Q2 is turned on.

Specifically, the switch circuit 13 includes the fifth resistor R5, the sixth resistor R6, the seventh resistor R7, the third switch tube Q3 and the fourth switch tube Q4. The fifth resistor R5, the sixth resistor R6 and the third switch tube Q3 constitute the second switch module 131. The seventh resistor R7 and the fourth switch tube Q4 constitute the third switch module 132.

A first terminal of the third switch tube Q3 is connected with the solar photovoltaic panel 11, a control terminal of the third switch tube Q3 is connected with a first terminal of the sixth resistor R6, a second terminal of the third switch tube Q3 is connected with the load, a second terminal of the sixth resistor R6 is connected with the detection circuit 12 and the third switch module 132 respectively, and the fifth resistor R5 is configured to be connected with the first terminal and the control terminal of the third switch tube Q3; that is, a first terminal of the fifth resistor R5 is connected with the first terminal of the third switch tube Q3, and a second terminal of the fifth resistor R5 is connected with the control terminal of the third switch tube Q3.

A first terminal of the seventh resistor R7 is connected with the second terminal of the third switch tube Q3, a second terminal of the seventh resistor R7 is connected with a control terminal of the fourth switch tube Q4, a first terminal of the fourth switch tube Q4 is connected with the detection circuit 12, and a second terminal of the fourth switch tube Q4 is used for grounding.

Specifically, in this embodiment, when the second switch tube Q2 is turned on, the first control signal is output to the control terminal of the third switch tube Q3; that is, after the second switch tube Q2 is turned on, the second terminal of the sixth resistor R6 is grounded to form a control loop. At this time, the third switch tube Q3 is turned on, and the solar photovoltaic panel 11 outputs an electrical signal to the load through the third switch tube Q3, and at the same time, the electrical signal flows into the fourth switch tube Q4 through the seventh resistor R7 so that the fourth switch tube Q4 is turned on, and the second control signal is fed back to the first terminal of the first switch module 121 to turn off the first switch module 121, and thus the detection circuit 12 stops working. At the same time, after the fourth switch tube Q4 is turned on, the first control signal is provided to the control terminal of the third switch tube Q3, so that the third switch tube Q3 is kept in a conductive state, and the self-holding switch function is realized. When the third switch tube Q3 is turned on, the second control signal is fed back to the first switch module 121 through the fourth switch tube Q4 to control the detection circuit 12 to stop working, so that the electric signal output by the solar photovoltaic panel 11 is directly used by the load, thereby avoiding the waste of the power energy of the solar photovoltaic panel due to the continuous working of the detection module 12, and improving the power generation capacity and utilization rate of the solar photovoltaic panel.

The anode of the diode D2 is connected with the first terminal of the first switch module 121, and the cathode of the diode D2 is connected with the first terminal of the third switch module 132.

Specifically, the solar photovoltaic panel 11 is configured to output an electrical signal, the electrical signal flows into the first switch tube Q1 after voltage division by the first resistor R1 and the second resistor R2, so that the control terminal of the first switch tube Q1 is at a high level, and the first switch tube Q1 is turned on because of the voltage difference. Further speaking, the diode D2 is also turned on because of the voltage difference, and at the same time, the electrical signal is applied to the voltage stabilizing diode D1 through the third resistor R3; after the voltage stabilizing diode D1 is broken down, the electrical signal flows into the second switch tube Q2 through the voltage stabilizing diode D1, and the second switch tube Q2 is turned on due to the voltage difference, so that a low level exists at the control terminal of the third switch tube Q3. At this time, the third switch tube Q3 is turned on due to the electrical signal provided by the solar photovoltaic panel 11 at the first terminal of the third switch tube Q3, and the electrical signal flows into the load through the third switch tube Q3; at the same time, the electrical signal passes through the seventh resistor R7 to turn on the fourth switch tube Q4, which results in a low-level signal at the first terminal of the fourth switch tube Q4. The low-level signal is fed back to the control terminal of the first switch tube Q1 through the diode D2 so that the first switch tube Q1 is turned off, and the detection circuit 12 stops working. When the third switch tube Q3 is turned on, the fourth switch tube Q4 is also turned on, and at this time, the first terminal of the fourth switch tube Q4 has a low-level signal, which is fed back to the first switch tube Q1 to make the detection circuit 12 stop working; however, the first terminal of the fourth switch tube Q4 is further connected with the control terminal of the third switch tube Q3 to turn on the third switch tube Q3, and thus, when the first switch tube Q1 is turned off, the third switch tube Q3 can still supply power to the load, thereby realizing the self-holding switch function and reducing the loss of power energy of the detection circuit.

Figure 5:
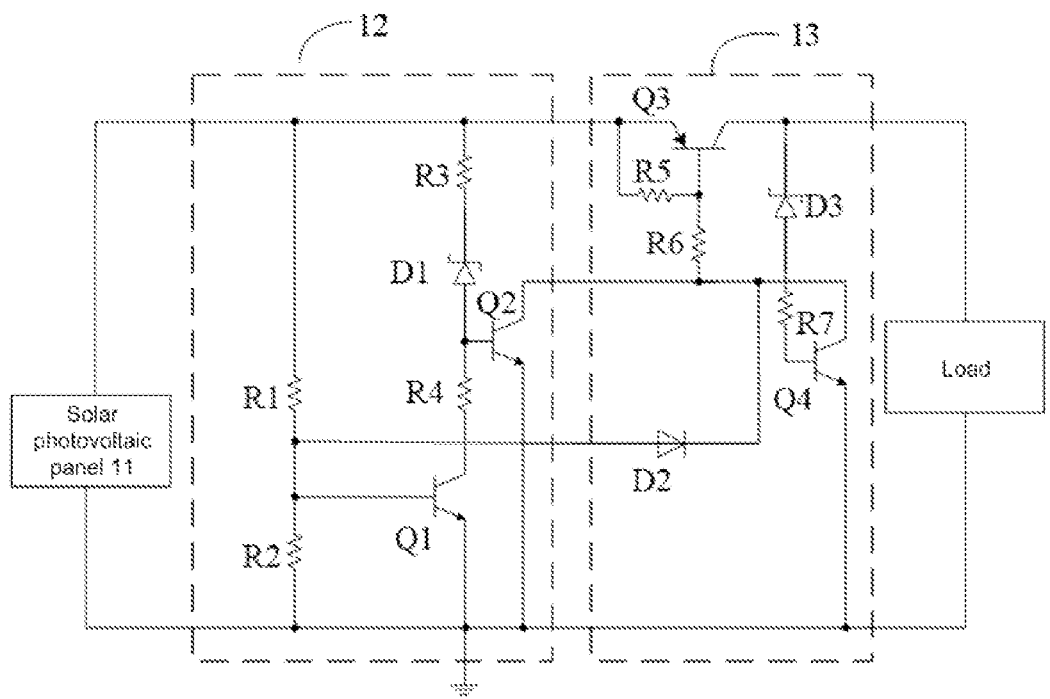
FIG. 5 is a structural circuit diagram of a power switch circuit according to another embodiment of the present application.

In another embodiment, please refer to FIG. 5, which is a structural circuit diagram of a power switch circuit according to another embodiment of the present application; as shown in FIG. 5, the power switch circuit 1 further includes a voltage stabilizing diode D3, the cathode of the voltage stabilizing diode D3 is connected with the second terminal of the third switch tube Q3, and the anode of the voltage stabilizing diode D3 is connected with the first terminal of the seventh resistor R7. The voltage stabilizing diode D3 is configured to detect the voltage output from the second terminal of the third switch tube Q3; when the switch circuit 13 is in the self-holding switch state, the electrical signal directly flows into the load if the power in the electrical signal output from the solar photovoltaic panel 11 is lower than that of the voltage stabilizing diode D3, and the fourth switch tube Q4 is turned off because there is no voltage difference, and thus the third switch tube Q3 is turned off and the power switch circuit is controlled to exit from the working mode. In this way, simply by providing the voltage stabilizing diode D3, the power switch circuit can be turned off when the power in the electric signal output by the solar photovoltaic panel 11 is low, thereby saving the power energy of the solar photovoltaic panel 11 and avoiding consumption of power energy of an external power grid or battery when the output power of the solar photovoltaic panel 11 cannot meet the power consumption of the power generation system itself.

The present application provides a power switch circuit, the power switch circuit includes a solar photovoltaic panel, a detection circuit and a switch circuit, wherein the detection circuit is connected with the solar photovoltaic panel and the switch circuit respectively, and the solar photovoltaic panel is further configured to be connected with a load through the switch circuit. The solar photovoltaic panel is configured to provide an electrical signal to the detection circuit, the detection circuit is configured to detect whether the power in the electric signal exceeds a preset threshold, and when it is detected that the power in the electrical signal exceeds the preset threshold, the detection circuit outputs a first control signal to the switch circuit to turn on the switch circuit; when the switch circuit is turned on, the solar photovoltaic panel supplies power to the load through the switch circuit, and the switch circuit feeds back a second control signal to the detection circuit so that the detection circuit stops working. In this way, when the power of the solar photovoltaic panel is greater than the preset threshold, the switch module is controlled to be turned on so that the solar photovoltaic panel supplies power to the load, which effectively avoids the waste of power energy caused by the solar photovoltaic panel being started too early or too late; and when the solar photovoltaic panel supplies power to the load, the detection circuit is controlled to stop working to reduce the loss of power energy of the detection circuit, thereby improving the power generation capacity of the solar photovoltaic panel and the utilization rate of photovoltaic power generation.

In a second aspect, an embodiment of the present application further provides a power switch, the power switch includes the power switch circuit in any of the embodiments as described above, the power switch controls the starting time of the solar photovoltaic panel by detecting the power of the solar photovoltaic panel, thereby avoiding the waste of the power energy generated by the solar photovoltaic panel and improving the power generation capacity of the solar photovoltaic panel.

It shall be noted that, the embodiments of the devices described above are only for illustrative purpose, the units illustrated as separate components may be or may not be physically separated, and components displayed as units may be or may not be physical units. That is, these units and components may be located in one place or distributed over multiple network units. Some or all of the modules may be selected according to actual needs to achieve the purpose of the solution of the embodiment.

Finally, it shall be noted that, the above embodiments are only used to illustrate the technical solutions of the present application, and are not intended to limit the present application. Under the idea of the present application, technical features in the above embodiments or different embodiments may also be combined, the steps may be implemented in any order, and many other variations in different aspects of the present application as described above are possible, and these variations are not provided in details for conciseness. Although the present application has been described in detail with reference to the foregoing embodiments, those of ordinary skill in the art shall appreciate that, the technical solutions described in the foregoing embodiments may still be modified or some of the technical features may be equivalently replaced. These modifications or replacements do not make the essence of the corresponding technical solutions deviate from the scope of the technical solutions of various embodiments of the present application.

The invention claimed is:

1. A power switch circuit, wherein the power switch circuit comprises a solar photovoltaic panel, a detection circuit, and a switch circuit:
    wherein the detection circuit comprises a first switch module and a power detection module, a first terminal of the first switch module is connected with the solar photovoltaic panel and the switch circuit respectively, a second terminal of the first switch module is connected with a third terminal of the power detection module, and a third terminal of the first switch module is used for grounding;
    wherein the first terminal of the first switch module is a control terminal; a first terminal of the power detection module is connected with the solar photovoltaic panel, a second terminal of the power detection module is connected with the switch circuit and the solar photovoltaic panel is connected with a load through the switch circuit;
    wherein the solar photovoltaic panel is configured to output an electrical signal to control the first switch module to be turned on;
    when the first switch module is turned on, the power detection module enters a working state to detect the power in the electrical signal;
    when the power in the electrical signal detected by the power detection module is greater than the preset threshold, the power detection module outputs a first control signal to the switch circuit to turn on the switch circuit; when the switch circuit is turned on, the solar photovoltaic panel supplying power to the load through the switch circuit and the switch circuit feeds back the second control signal to the first terminal of the first switch module to turn off the first switch module; when the firs switch module is turned off, the detection circuit stops working.

2. The power switch circuit according to claim 1, wherein the first switch module comprises a voltage dividing unit and a first switch tube (Q1);
    a first terminal of the voltage dividing unit is connected with the solar photovoltaic panel, a second terminal of the voltage dividing unit is connected with a control terminal of the first switch tube (Q1), and a third terminal of the voltage dividing unit is used for grounding; the control terminal of the first switch tube (Q1) is further connected with the switch circuit, a first terminal of the first switch tube (Q1) is connected with the third terminal of the power detection module, and a second terminal of the first switch tube (Q1) is used for grounding.

3. The power switch circuit according to claim 2, wherein the voltage dividing unit comprises a first resistor (R1) and a second resistor (R2):

a first terminal of the first resistor (R1) is connected with the solar photovoltaic panel, a second terminal of the first resistor (R1) is connected with the control terminal of the first switch tube (Q1), a first terminal of the second resistor (R2) is connected with the control terminal of the first switch tube (Q1), and a second terminal of the second resistor (R2) is used for grounding.

4. The power switch circuit according to claim 1, wherein the power detection module comprises a third resistor (R3), a fourth resistor (R4), a second switch tube (Q2) and a voltage stabilizing diode (D1);
a first terminal of the third resistor (R3) is connected with the solar photovoltaic panel, a second terminal of the third resistor (R3) is connected with the cathode of the voltage stabilizing diode (D1), the anode of the voltage stabilizing diode (D1) is connected with a control terminal of the second switch tube (Q2) and a first terminal of the fourth resistor (R4), a first terminal of the second switch tube (Q2) is connected with the switch circuit, a second terminal of the second switch tube (Q2) is used for grounding, and a second terminal of the four resistor (R4) is connected with the second terminal of the first switch module.

5. The power switch circuit according to claim 1, wherein the switch circuit comprises a second switch module and a third switch module;
a first terminal of the second switch module is connected with the solar photovoltaic panel, a second terminal of the second switch module is connected with the detection circuit, a third terminal of the second switch module is connected with a second terminal of the third switch module and the load respectively, wherein the second terminal of the second switch module is a control terminal, and the second terminal of the third switch module is a control terminal; a first terminal of the third switch module is connected with the detection circuit, a third terminal of the third switch module is used for grounding;
the detection circuit is configured to detect the electrical signal output by the solar photovoltaic panel, and in response to the power in the electrical signal greater than the preset threshold, the detection circuit outputs a first control signal to the second terminal of the second switch module to turn on the second switch module, the electrical signal flows into the second terminal of the third switch module while flowing into the load through the second switch module so as to turn on the third switch module, and a second control signal is fed back to the first terminal of the first switch module to turn off the first switch module so that the detection circuit stops working.

6. The power switch circuit according to claim 5, wherein the switch circuit further comprises a diode (D2);
the anode of the diode (D2) is connected with the first terminal of the first switch module, and the cathode of the diode (D2) is connected with the first terminal of the third switch module.

7. The power switch circuit according to claim 5, wherein the second switch module comprises a fifth resistor (R5), a sixth resistor (R6) and a third switch tube (Q3);
a first terminal of the third switch tube (Q3) is connected with the solar photovoltaic panel, a control terminal of the third switch tube (Q3) is connected with a first terminal of the sixth resistor (R6), a second terminal of the third switch tube (Q3) is connected with the load, a second terminal of the sixth resistor (R6) is connected with the detection circuit and the first terminal of the third switch module respectively, and the fifth resistor (R5) is configured to be connected with the first terminal and the control terminal of the third switch tube (Q3).

8. The power switch circuit according to claim 7, wherein the third switch module comprises a seven resistor (R7) and a fourth switch tube Q4;
a first terminal of the seven resistor (R7) is connected with the second terminal of the third switch tube Q3, a second terminal of the seven resistor (R7) is connected with a control terminal of the fourth switch tube Q4, a first terminal of the fourth switch tube Q4 is connected with the detection circuit, and a second terminal of the fourth switch tube Q4 is used for grounding.

9. A power switch, comprising a power switch circuit according to claim 1.

10. The power switch according to claim 9, wherein the first switch module comprises a voltage dividing unit and a first switch tube (Q1);
a first terminal of the voltage dividing unit is connected with the solar photovoltaic panel, a second terminal of the voltage dividing unit is connected with a control terminal of the first switch tube (Q1), and a third terminal of the voltage dividing unit is used for grounding; the control terminal of the first switch tube (Q1) is further connected with the switch circuit, a first terminal of the first switch tube (Q1) is connected with the third terminal of the power detection module, and a second terminal of the first switch tube (Q1) is used for grounding.

11. The power switch according to claim 10, wherein the voltage dividing unit comprises a first resistor (R1) and a second resistor (R2);
a first terminal of the first resistor (R1) is connected with the solar photovoltaic panel, a second terminal of the first resistor (R1) is connected with the control terminal of the first switch tube (Q1), a first terminal of the second resistor (R2) is connected with the control terminal of the first switch tube (Q1), and a second terminal of the second resistor (R2) is used for grounding.

12. The power switch according to claim 9, wherein the power detection module comprises a third resistor (R3), a fourth resistor (R4), a second switch tube (Q2) and a voltage stabilizing diode (D1);
a first terminal of the third resistor (R3) is connected with the solar photovoltaic panel, a second terminal of the third resistor (R3) is connected with the cathode of the voltage stabilizing diode (D1), the anode of the voltage stabilizing diode (D1) is connected with a control terminal of the second switch tube (Q2) and a first terminal of the fourth resistor (R4), a first terminal of the second switch tube (Q2) is connected with the switch circuit, a second terminal of the second switch tube (Q2) is used for grounding, and a second terminal of the fourth resistor (R4) is connected with the second terminal of the first switch module.

13. The power switch according to claim 9, wherein the switch circuit comprises a second switch module and a third switch module;
a first terminal of the second switch module is connected with the solar photovoltaic panel, a second terminal of the second switch module is connected with the detection circuit, a third terminal of the second switch module is connected with a second terminal of the third switch module and the load respectively, wherein the second terminal of the second switch module is a control terminal, and the second terminal of the third switch module is a control terminal; a first terminal of the third switch module is connected with the detection circuit, a third terminal of the third switch module is used for grounding;

the detection circuit is configured to detect the electrical signal output by the solar photovoltaic panel, and in response to the power in the electrical signal greater than the preset threshold, the detection circuit outputs a first control signal to the second terminal of the second switch module to turn on the second switch module, the electrical signal flows into the second terminal of the third switch module while flowing into the load through the second switch module so as to turn on the third switch module, and a second control signal is fed back to the first terminal of the first switch module to turn off the first switch module so that the detection circuit stops working.

14. The power switch according to claim 13, wherein the switch circuit further comprises a diode (D2);

the anode of the diode (D2) is connected with the first terminal of the first switch module, and the cathode of the diode (D2) is connected with the first terminal of the third switch module.

15. The power switch according to claim 13, wherein the second switch module comprises a fifth resistor (R5), a sixth resistor (R6) and a third switch tube (Q3);

a first terminal of the third switch tube (Q3) is connected with the solar photovoltaic panel, a control terminal of the third switch tube (Q3) is connected with a first terminal of the resistor R6, a second terminal of the third switch tube (Q3) is connected with the load, a second terminal of the sixth resistor (R6) is connected with the detection circuit and the first terminal of the third switch module respectively, and the fifth resistor (R5) is configured to be connected with the first terminal and the control terminal of the third switch tube (Q3).

16. The power switch according to claim 15, wherein the third switch module comprises a seventh resistor (R7) and a fourth switch tube;

a first terminal of the seventh resistor (R7) is connected with the second terminal of the third switch tube (Q3), a second terminal of the seventh resistor (R7) is connected with a control terminal of the fourth switch tube (Q4), a first terminal of the fourth switch tube (Q4) is connected with the detection circuit, and a second terminal of the fourth switch tube (Q4) is used for grounding.

* * * * *